US012782447B2

(12) United States Patent
Jo et al.

(10) Patent No.: US 12,782,447 B2
(45) Date of Patent: Nov. 3, 2026

(54) BATTERY SENSING UNIT AND BATTERY MODULE INCLUDING THE SAME

(71) Applicant: SK ON CO., LTD., Seoul (KR)

(72) Inventors: Soo Hwan Jo, Daejeon (KR); Ji Eun Kang, Daejeon (KR); In Seob Kang, Daejeon (KR); Hee Jin Lee, Daejeon (KR)

(73) Assignee: SK On Co., Ltd., Seoul (KR)

( * ) Notice: Subject to any disclaimer, the term of this patent is extended or adjusted under 35 U.S.C. 154(b) by 301 days.

(21) Appl. No.: 18/422,365

(22) Filed: Jan. 25, 2024

(65) Prior Publication Data

US 2024/0280638 A1 Aug. 22, 2024

(30) Foreign Application Priority Data

Feb. 16, 2023 (KR) ........................ 10-2023-0020752

(51) Int. Cl.
*G01R 31/382* (2019.01)
*G01K 1/14* (2021.01)

(52) U.S. Cl.
CPC ............. *G01R 31/382* (2019.01); *G01K 1/14* (2013.01)

(58) Field of Classification Search
CPC ...... G01R 31/382; G01R 31/385; G01K 1/14; H01M 2220/20; H01M 10/425; H01M 50/503; H01M 50/507; H01M 50/569; H01M 10/482; H01M 50/258; H01M 50/519; H01M 10/486; H01M 50/502; Y02E 60/10
See application file for complete search history.

(56) References Cited

U.S. PATENT DOCUMENTS

| | | | | |
|---|---|---|---|---|
| 8,046,026 B2 | 10/2011 | Koh | | |
| 9,516,231 B2 | 12/2016 | Jeong | | |
| 2013/0078487 A1* | 3/2013 | Shin | H01M 50/211 | 429/82 |
| 2016/0141712 A1* | 5/2016 | Choi | H01M 50/227 | 320/112 |
| 2019/0348720 A1* | 11/2019 | Oh | H01M 50/567 | |
| 2021/0119309 A1 | 4/2021 | Jeong et al. | | |
| 2021/0184379 A1* | 6/2021 | Jung | H01M 10/425 | |
| 2023/0261332 A1* | 8/2023 | Fukushima | H05K 1/148 | 174/70 B |

FOREIGN PATENT DOCUMENTS

| | | | |
|---|---|---|---|
| EP | 3565022 | A1 | 11/2019 |
| EP | 3591732 | B1 | 3/2021 |
| KR | 10-2019-0061378 | A | 6/2019 |
| WO | 2010/113455 | A1 | 10/2010 |
| WO | 2022/009667 | A1 | 1/2022 |

* cited by examiner

*Primary Examiner* — Daniel R Miller
(74) *Attorney, Agent, or Firm* — Jones Day

(57) ABSTRACT

A battery sensing unit and a battery module including the battery sensing unit are disclosed. In an embodiment, the battery sensing unit forming one plane comprises a sensing body extending in a transverse direction, a first sensing bridge extending forward from a first end of the sensing body, a second sensing bridge extending forward from a second end of the sensing body, a first sensing connector forming a shape extending from an end of the first sensing bridge toward the second sensing bridge, and a second sensing connector forming a shape extending from an end of the second sensing bridge toward the first sensing bridge. The first sensing connector is positioned between the sensing body and the second sensing connector.

13 Claims, 9 Drawing Sheets

BATTERY SENSING UNIT AND BATTERY MODULE INCLUDING THE SAME

CROSS-REFERENCE TO RELATED APPLICATIONS

This patent document claims the priority and benefits of Korean Patent Application No. 10-2023-0020752 filed on Feb. 16, 2023, which is incorporated herein by reference in its entirety.

TECHNICAL FIELD

The technology and implementations disclosed in this patent document generally relate to a battery sensing unit and a battery module including the same.

BACKGROUND

A battery module may include a battery sensing unit that is connected to bus bars to perform a battery sensing operation. Bus bars connect battery cells in the battery module and allow current to flow from and to the individual battery cells.

SUMMARY

The disclosed technology can be implemented in some embodiments to provide a battery sensing unit that is formed as a unibody and has improved durability, and a battery module including the same.

In addition, the disclosed technology can be implemented in some embodiments to provide a battery sensing unit, that is folded and bent, and a battery module including the same.

In one aspect of the disclosed technology, a battery sensing unit forming one plane may comprise a sensing body extending in a transverse direction; a first sensing bridge extending forward from a first end of the sensing body; a second sensing bridge extending forward from a second end of the sensing body; a first sensing connector forming a shape extending from an end of the first sensing bridge toward the second sensing bridge; and a second sensing connector forming a shape extending from an end of the second sensing bridge toward the first sensing bridge, wherein the first sensing connector is positioned between the sensing body and the second sensing connector.

When each of the first sensing bridge and the second sensing bridge is folded, each of the first sensing connector and the second sensing connector may form a shape extending in a longitudinal direction.

The battery sensing unit may include a first face and a second face formed opposite the first face. In a state in which each of the first sensing bridge and the second sensing bridge is folded, the first face of the sensing body may face upward, and each of the first face of the first sensing connector and the first face of the second sensing connector may face downward.

In a state in which each of the first sensing bridge and the second sensing bridge is folded, the sensing body may be disposed between the first sensing connector and the second sensing connector.

In a state in which each of the first sensing bridge and the second sensing bridge is bent, the first sensing connector and the second sensing connector may face each other.

The first sensing bridge may be bent between a folded portion of the first sensing bridge and the first sensing connector, and the second sensing bridge may be bent between a folded portion of the second sensing bridge and the second sensing connector.

The battery sensing unit may further comprise at least one of a first sensing extension positioned between the sensing body and the first sensing connector and extending from the first sensing connector, or a second sensing extension positioned between the sensing body and the first sensing connector and extending from the sensing body.

The sensing body, the first sensing bridge, the second sensing bridge, the first sensing connector, and the second sensing connector may be formed as a unibody.

The sensing body, the first sensing bridge, the second sensing bridge, the first sensing connector, and the second sensing connector may include a flexible printed circuit board (FPCB).

In another aspect of the disclosed technology, a battery module may comprise a battery cell assembly including a plurality of battery cells disposed in a front-rear direction, each of the plurality of battery cells including a first electrode lead and a second electrode lead that protrude in a transverse direction and are formed opposite to each other; a first bus bar unit coupled to the first electrode lead; a second bus bar unit coupled to the second electrode lead; and a battery sensing unit configured to connect the first bus bar unit and the second bus bar unit, wherein the battery sensing unit includes a first sensing connector coupled to the first bus bar unit, a second sensing connector coupled to the second bus bar unit, a sensing body extending in the transverse direction, a first sensing bridge configured to connect a first end of the sensing body and the first sensing connector, the first sensing bridge being folded and bent, and a second sensing bridge configured to connect a second end of the sensing body and the second sensing connector, the second sensing bridge being folded and bent.

The sensing body, the first sensing bridge, the second sensing bridge, the first sensing connector, and the second sensing connector may be formed as a unibody.

The first sensing bridge may be bent between a folded portion of the first sensing bridge and the first sensing connector, and the second sensing bridge may be bent between a folded portion of the second sensing bridge and the second sensing connector.

The battery sensing unit may further include at least one of a first sensing extension positioned between the sensing body and the first sensing connector and extending from the first sensing connector, or a second sensing extension positioned between the sensing body and the first sensing connector and extending from the sensing body.

The battery module may further comprise at least one of a first temperature sensor connected to the first sensing extension, or a second temperature sensor connected to the second sensing extension.

The first temperature sensor may be positioned on a front face of the battery cell assembly, and the second temperature sensor may be positioned on an upper face of the battery cell assembly. Each temperature sensor is used to measure a temperature of the battery cell assembly.

The disclosed technology can be implemented in some embodiments to provide a battery sensing unit that is formed as a unibody and has improved durability, and a battery module including the battery sensing unit that is formed as a unibody.

The disclosed technology can be implemented in some embodiments to provide a battery sensing unit that is folded and bent, and a battery module including the battery sensing unit that is folded and bent.

A battery sensing unit and a battery module including the battery sensing unit based on some embodiments of the disclosed technology can be widely applied in green technology fields such as electric vehicles, battery charging stations, and other battery-based solar power generation and wind power generation.

A battery sensing unit and a battery module including the battery sensing unit based on some embodiments of the disclosed technology can be used in eco-friendly electric vehicles, hybrid vehicles, etc. to prevent climate change by suppressing air pollution and greenhouse gas emissions.

BRIEF DESCRIPTION OF THE DRAWINGS

The accompanying drawings illustrate examples of embodiments of various technical features disclosed in the disclosure.

DETAILED DESCRIPTION

Reference will now be made in detail to embodiments of the disclosed technology, examples of which are illustrated in the accompanying drawings. However, the following description is merely an example and does not intended to limit the disclosed technology to a specific implementation.

The disclosed technology can be implemented in some embodiments to provide a battery sensing unit connected to bus bars by attaching a plurality of separate parts to each other. The disclosed technology can be implemented in some embodiments to reduce the complexity of the overall manufacturing process that would have been caused by a process for attaching the plurality of parts. In addition, the disclosed technology can be implemented in some embodiments to prevent connection portions of the plurality of parts from being damaged, and to improve the durability of the battery sensing unit.

Figure 1:
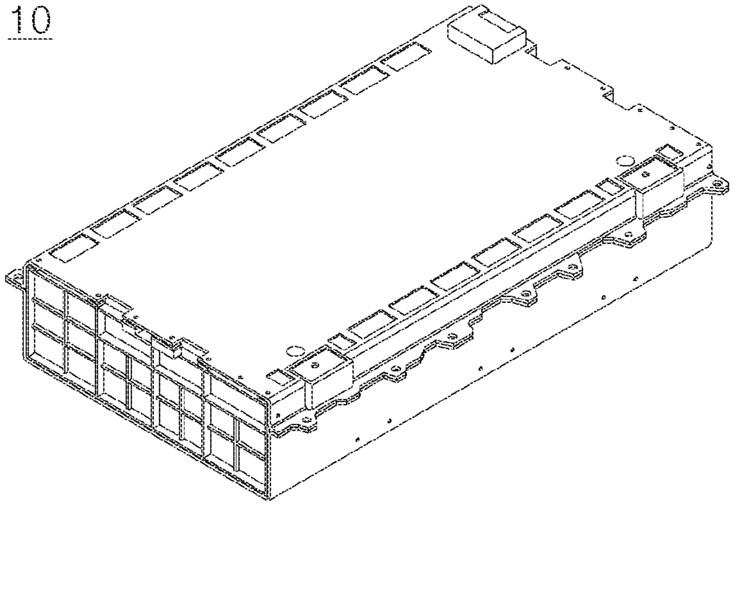
FIG. 1 illustrates a battery module based on an embodiment of the disclosed technology.
Figure 2:
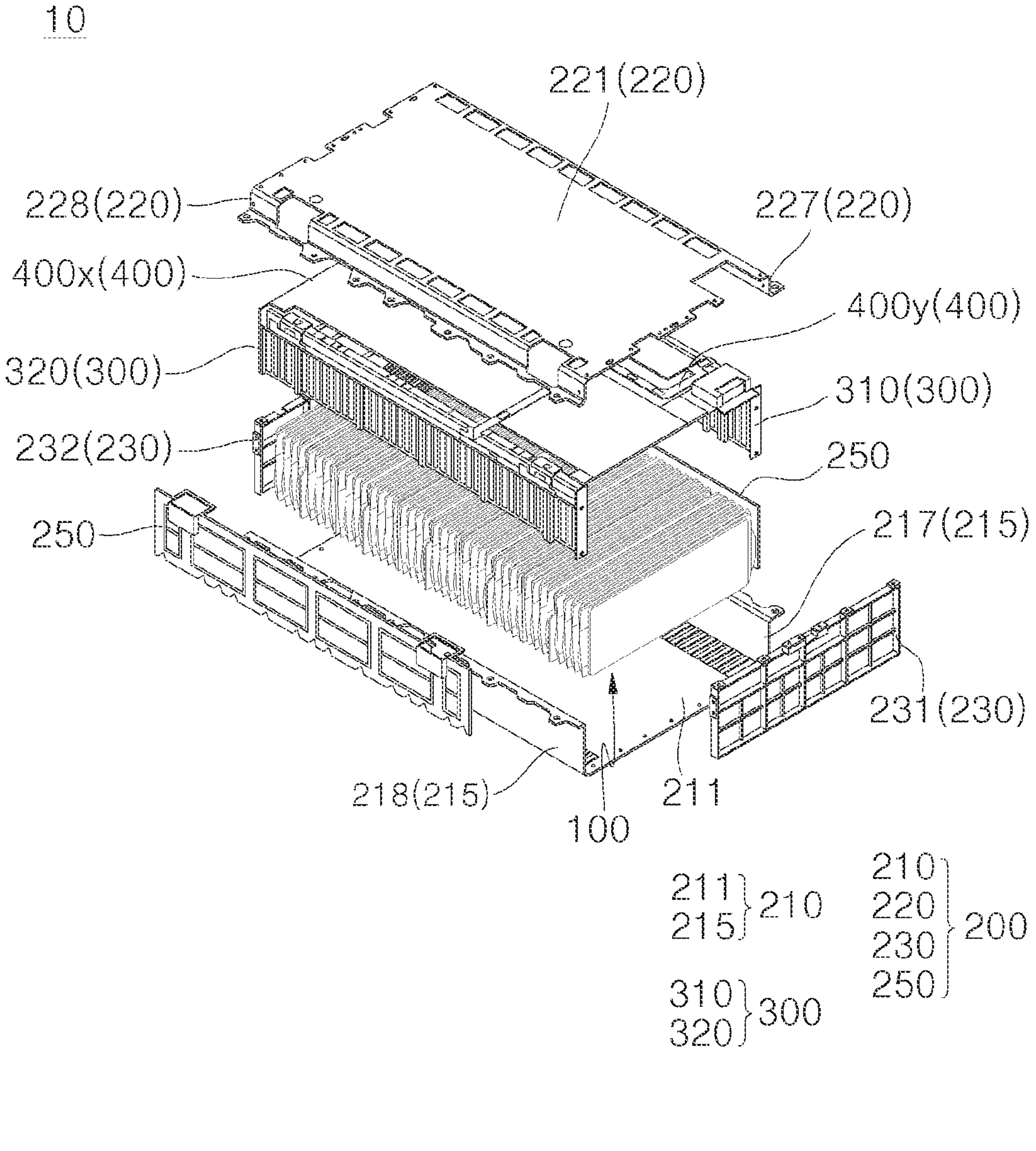
FIG. 2 is an exploded perspective view of a battery module illustrated in FIG. 1.

FIG. 1 illustrates a battery module 10 based on an embodiment of the disclosed technology. FIG. 2 is an exploded perspective view of the battery module 10 illustrated in FIG. 1. In some embodiments of the disclosed technology, an up-down direction and a front-rear direction may be set based on FIG. 2.

Referring to FIGS. 1 and 2, the battery module 10 may include a battery cell assembly 100. The battery cell assembly 100 may include a plurality of battery cells. The plurality of battery cells may be arranged or stacked in one direction. For example, a direction in which the plurality of battery cells are arranged or stacked may be a longitudinal direction or a length direction of the battery module 10. The longitudinal direction of the battery module 10 may be the front-rear direction of the battery module 10.

Each of the plurality of battery cells may include a battery cell body. The battery cell body may extend from one end of a battery cell and lead to another end of the battery cell. In some embodiments, one end of the battery cell body may be referred to as a "first end" of the battery cell body, and the other end of the battery cell body may be referred to as a "second end" of the battery cell body.

For example, the battery cell body may form a shape extending in a width direction or a transverse direction of the battery module 10. In other words, the longitudinal direction or the length direction of the battery cell body may be the width direction or the transverse direction of the battery module 10.

Each of the plurality of battery cells may include an electrode lead. The electrode lead may form a shape extending from the battery cell body. For example, the electrode lead may form a shape protruding from the battery cell body. For example, the electrode lead may include a first electrode lead protruding from the first end of the battery cell body. For example, the electrode lead may include a second electrode lead protruding from the second end of the battery cell body.

The battery cell assembly 100 may include a heat shield pad. The heat shield pad may be disposed between the plurality of battery cells. When thermal runaway occurs in one battery cell among the plurality of battery cells, the heat shield pad may prevent heat or flame from moving from the one battery cell, in which the thermal runaway occurs, to battery cells around the one battery cell. The heat shield pad may include a heat resistant material.

The battery module 10 may include a case 200. The case 200 may be referred to as a "battery case." The case 200 may include a first case 210. The first case 210 may accommodate the battery cell assembly 100.

The first case 210 may include a bottom case 211. The bottom case 211 may form the bottom of the case 200. The bottom case 211 may be positioned under the battery cell assembly 100.

In other words, the battery cell assembly 100 may be loaded on the bottom case 211. The bottom case 211 may form a shape of a plate. The bottom case 211 may be referred to as a "bottom plate." In some implementations, the term "case" can be used to indicate a part of a wall of a case. For example, the terms "top case" and "bottom case" can be used to indicate a top wall and a bottom wall of a case, respectively. As another example, the terms "front case" and "rear case" can be used to indicate a front wall and a rear wall of a case, respectively.

The bottom plate 211 may include four edges. The four edges of the bottom plate 211 may form a perimeter of the bottom plate 211. Two connection edges of the bottom plate 211 may be two edges extending along the longitudinal direction of the battery module 10 among the four edges of the bottom plate 211.

In some implementations, the term "first connection edge" of the bottom plate 211 may be used to indicate a connection edge adjacent to the first end of the battery cell body among the two connection edges of the bottom plate

211. The first connection edge of the bottom plate 211 may extend rearward from one end of a front edge of the bottom plate 211 and lead to one end of a rear edge of the bottom plate 211.

In some implementations, the term "second connection edge" of the bottom plate 211 may be used to indicate a connection edge adjacent to the second end of the battery cell body among the two connection edges of the bottom plate 211. The second connection edge of the bottom plate 211 may extend rearward from another end of the front edge of the bottom plate 211 and lead to another end of the rear edge of the bottom plate 211.

The first connection edge and the second connection edge of the bottom plate 211 may be parallel to each other.

The first case 210 may include a side case 215. The side case 215 may extend upward from the bottom plate 211. The side case 215 may be formed as a unibody with the bottom plate 211.

A plurality of side cases 215 may be provided. For example, the side cases 215 may include a first side case 217 extending upward from the first connection edge of the bottom plate 211.

For example, the side cases 215 may include a second side case 218 extending upward from the second connection edge of the bottom plate 211. The second side case 218 may face the first side case 217. A direction from the first side case 217 to the second side case 218 may be parallel to the transverse direction of the battery module 10.

The case 200 may include a second case 220. The second case 220 may include a top case 221. The top case 221 may be formed of a material containing metal. The top case 221 may be referred to as an "upper cover."

The top case 221 may include four edges. The four edges of the top case 221 may form a perimeter of the top case 221. Two connection edges of the top case 221 may be two edges extending along the longitudinal direction of the battery module 10 among the four edges of the top case 221.

In some implementations, the term "first connection edge" of the top case 221 may be used to indicate a connection edge adjacent to the first end of the battery cell body among the two connection edges of the top case 221. In some implementations, the term "second connection edge" of the top case 221 may be used to indicate a connection edge adjacent to the second end of the battery cell body among the two connection edges of the top case 221. The first connection edge and the second connection edge of the top case 221 may be parallel to each other.

The second case 220 may include wing cases 227 and 228. The wing cases 227 and 228 may be formed as a unibody with the top case 221. The wing cases 227 and 228 may extend downward from the edges of the top case 221.

For example, the wing cases 227 and 228 may include a first wing case 227 extending downward from the first connection edge of the top case 221. For example, the wing cases 227 and 228 may include a second wing case 228 extending downward from the second connection edge of the top case 221.

The wing cases 227 and 228 may be coupled or fastened to the side cases 215. For example, the first wing case 227 may be coupled or fastened to the first side case 217. For example, the second wing case 228 may be coupled or fastened to the second side case 218.

The case 200 may include front and rear cases 230. The front and rear cases 230 may include a front case 231. The front case 231 may face the battery cell assembly 100. The front case 231 may be positioned in front of the battery cell assembly 100.

The front case 231 may be connected or coupled to a front end of the first side case 217. The front case 231 may be connected or coupled to a front end of the second side case 218. The front case 231 may be connected or coupled to a front end of the bottom case 211. The front case 231 may be referred to as a "first cover plate."

The front and rear cases 230 may include a rear case 232. The rear case 232 may face the battery cell assembly 100. The rear case 232 may be positioned behind the battery cell assembly 100.

The rear case 232 may be connected or coupled to a rear end of the first side case 217. The rear case 232 may be connected or coupled to a rear end of the second side case 218. The rear case 232 may be connected or coupled to a rear end of the bottom case 211. The rear case 232 may be referred to as a "second cover plate."

The front and rear cases 230 may be referred to as "cover plates." The cover plate 230 may indicate at least one of the first cover plate 231 and the second cover plate 232.

The case 200 may include an insulating cover 250. The insulating cover 250 may be disposed between the battery cell assembly 100 and the side case 215. The insulating cover 250 may include an insulating material.

The battery module 10 may include a bus bar unit 300. The bus bar unit 300 may be electrically connected to the battery cell assembly 100. The bus bar unit 300 may be disposed between the battery cell assembly 100 and the case 200. The bus bar unit 300 may electrically connect the plurality of battery cells. A plurality of bus bar units 300 may be provided.

For example, the bus bar unit 300 may include a first bus bar unit 310 disposed between the first side case 217 and the battery cell assembly 100. The first bus bar unit 310 may electrically connect the first electrode leads of the plurality of battery cells.

For example, the bus bar unit 300 may include a second bus bar unit 320 disposed between the second side case 218 and the battery cell assembly 100. The second bus bar unit 320 may electrically connect second electrode leads of the plurality of battery cells.

The battery module 10 may include a battery sensing unit 400. The battery sensing unit 400 may include a sensing frame 400*x*. The sensing frame 400*x* may connect the first bus bar unit 310 and the second bus bar unit 320.

The sensing frame 400*x* may be positioned between the battery cell assembly 100 and the top case 221. The sensing frame 400*x* may form a shape of a plate or board.

The battery sensing unit 400 may include a battery sensor 400*y*. The battery sensor 400*y* may be connected or fixed to the sensing frame 400*x*. The battery sensor 400*y* may be connected to the bus bar unit 300.

For example, the battery sensor 400*y* may be electrically connected to the bus bar unit 300. For example, the battery sensor 400*y* may be electrically connected to the first bus bar unit 310 and electrically connected to the second bus bar unit 320.

For example, the battery sensor 400*y* may obtain a signal from the bus bar unit 300. For example, the battery sensor 400*y* may obtain an electrical signal from the bus bar unit 300. For example, the battery sensor 400*y* may obtain an electrical signal from the bus bar unit 300 by detecting current or voltage of the bus bar. The electrical signal obtained by the battery sensor 400*y* may be a current or a voltage. Hence, the battery sensor 400*y* may obtain information on charge and discharge states of the battery cell assembly 100. For example, the charge/discharge status of the battery cell assembly 100 may be determined based on the electrical signal obtained by the battery sensor 400*y* from the bus bar unit by detecting current or electric potential of the bus bar.

For example, the battery sensor 400*y* may include a temperature sensor. For example, the temperature sensor included in the battery sensor 400*y* may obtain temperature information of the battery cell assembly 100.

The battery sensor 400*y* may be connected to an external device. For example, the battery sensor 400*y* may be connected to a battery management system (BMS). For example, the battery sensor 400*y* may transmit information on the battery cell assembly 100 to the BMS. The information on the battery cell assembly 100 may include at least one of information on the charge/discharge state of the battery cell assembly 100 or information on the temperature of the battery cell assembly 100.

Figure 3:
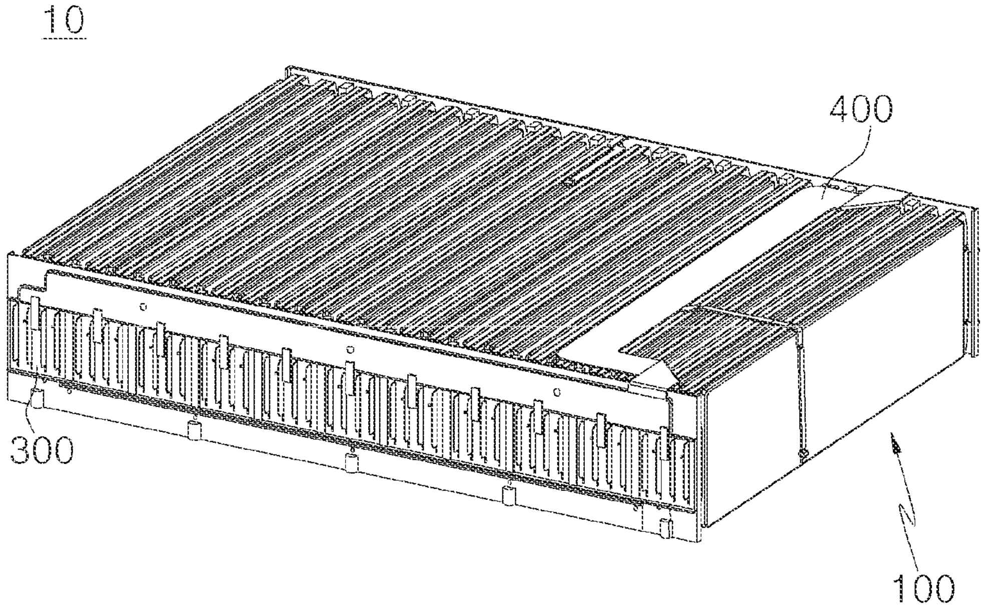
FIG. 3 illustrates a battery module including a battery sensing unit that is folded and bent based on an embodiment of the disclosed technology.
Figure 4:
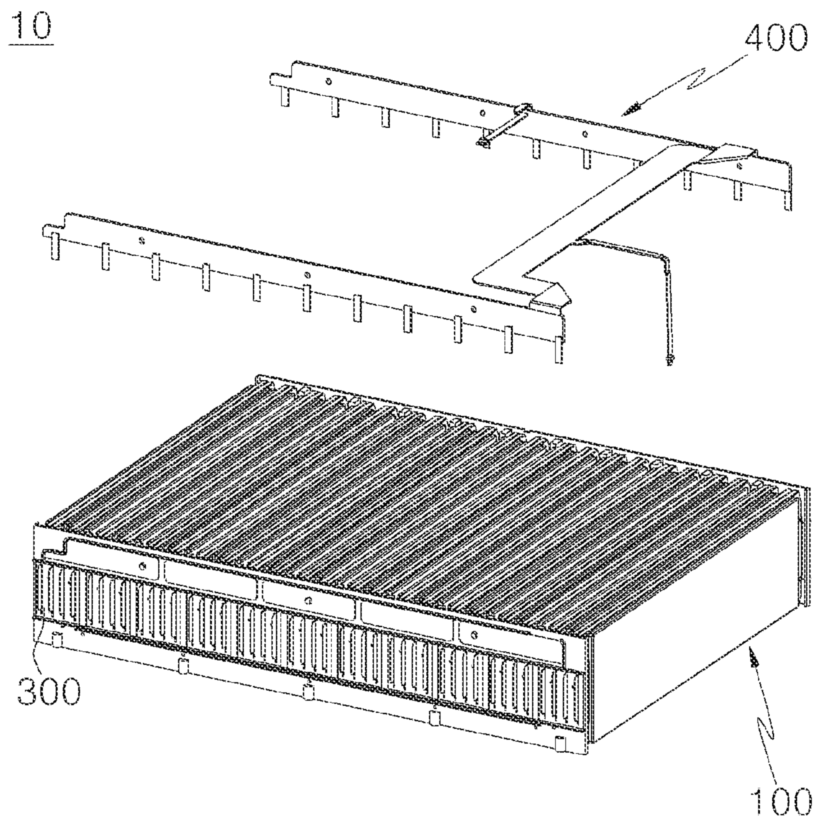
FIG. 4 is an exploded perspective view of a battery module illustrated in FIG. 3.

FIG. 3 illustrates a battery module including a battery sensing unit that is folded and bent based on an embodiment of the disclosed technology. For convenience of explanation, the illustration of the case 200 (see FIG. 2) may be omitted in FIG. 3. FIG. 4 is an exploded perspective view of a battery module illustrated in FIG. 3.

Referring to FIGS. 3 and 4, the battery sensing unit 400 may include a flexible printed circuit board (FPCB). The FPCB is bendable. The FPCB is foldable.

The bus bar unit 300 may be coupled to the battery cell assembly 100 formed by stacking the plurality of battery cells. One side of the battery sensing unit 400 may be connected to the first bus bar unit 310 (see FIG. 2), and other side of the battery sensing unit 400 may be connected to the second bus bar unit 320 (see FIG. 2).

Figure 5:
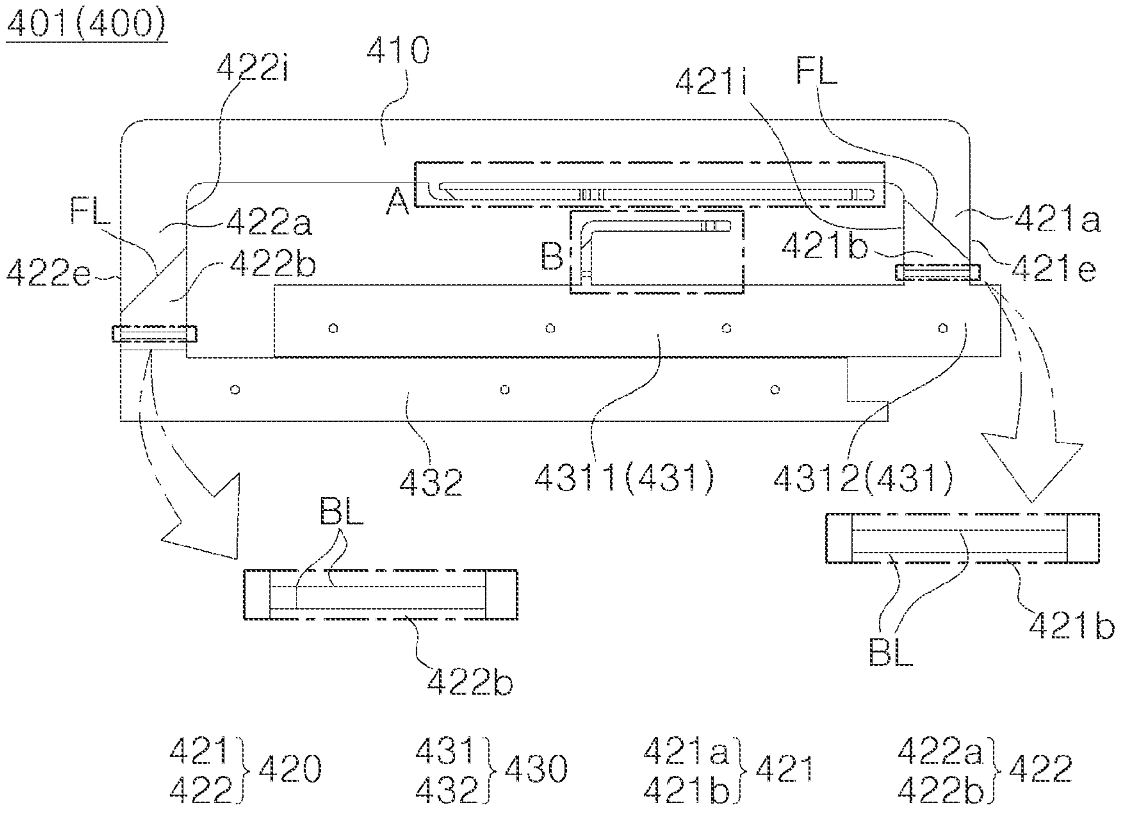
FIG. 5 illustrates a battery sensing unit forming one plane based on an embodiment of the disclosed technology.

FIG. 5 illustrates a battery sensing unit forming one plane based on an embodiment of the disclosed technology.

Referring to FIG. 5, the battery sensing unit 400 may form one plane. For example, the battery sensing unit 400 may have a sheet shape. For example, the battery sensing unit 400 may include a sheet shaped FPCB.

For example, the battery sensing unit 400 may form both faces. For example, a first face 401 of the battery sensing unit 400 may be observed in FIG. 5. Both faces of the battery sensing unit 400 may be formed opposite to each other.

The battery sensing unit 400 may include a sensing body 410. The sensing body 410 may form an extended or elongated shape in one direction. An extended or elongated direction of the sensing body 410 may be a longitudinal direction of the sensing body 410.

The longitudinal direction of the sensing body 410 may be parallel to a direction from the first bus bar unit 310 (see FIG. 2) to the second bus bar unit 320 (see FIG. 2). For example, the longitudinal direction of the sensing body 410 may be the transverse direction of the battery module 10.

A first end of the sensing body 410 may be adjacent to the first bus bar unit 310 (see FIG. 2). A second end of the sensing body 410 may be adjacent to the second bus bar unit 320 (see FIG. 2).

The battery sensing unit 400 may include a sensing bridge 420. The sensing bridge 420 may form a shape extending from the sensing body 410. For example, the sensing bridge 420 may extend from the end of the sensing body 410.

The sensing bridge 420 may include a first sensing bridge 421. The first sensing bridge 421 may extend in one direction from the first end of the sensing body 410. For example, the first sensing bridge 421 may form a shape extending in the longitudinal direction of the battery module 10 (see FIG. 2) at the first end of the sensing body 410. For example, the first sensing bridge 421 may form a shape extending forward from the first end of the sensing body 410.

The sensing bridge 420 may include a second sensing bridge 422. The second sensing bridge 422 may extend in one direction from the second end of the sensing body 410. For example, the second sensing bridge 422 may form a shape extending in the longitudinal direction of the battery module 10 (see FIG. 2) at the second end of the sensing body 410. For example, the second sensing bridge 422 may form a shape extending forward from the second end of the sensing body 410.

An extended length of the first sensing bridge 421 may be different from an extended length of the second sensing bridge 422. For example, a length of the first sensing bridge 421 extending forward from the sensing body 410 may be less than a length of the second sensing bridge 422 extending forward from the sensing body 410.

The battery sensing unit 400 may be foldable. For example, the battery sensing unit 400 may be folded along a fold line FL. For example, the sensing bridge 420 may be folded along the fold line FL formed or positioned on the sensing bridge 420. The fold line FL may be a virtual line.

The sensing bridge 420 may be divided into two portions by the fold line FL formed on the sensing bridge 420. For example, the first sensing bridge 421 may include a first sensing bridge proximal portion 421*a* and a first sensing bridge distal portion 421*b*. For example, the second sensing bridge 422 may include a second sensing bridge proximal portion 422*a* and a second sensing bridge distal portion 422*b*.

A boundary between the first sensing bridge proximal portion 421*a* and the first sensing bridge distal portion 421*b* may be a fold line FL positioned on the first sensing bridge 421. A boundary between the second sensing bridge proximal portion 422*a* and the second sensing bridge distal portion 422*b* may be a fold line FL positioned on the second sensing bridge 422.

The first sensing bridge proximal portion 421*a* may be connected to the first end of the sensing body 410. The second sensing bridge proximal portion 422*a* may be connected to the second end of the sensing body 410.

The battery sensing unit 400 may include a sensing connector 430. The sensing connector 430 may extend from the sensing bridge 420. For example, the sensing connector 430 may extend from an end of the sensing bridge 420 in the longitudinal direction of the sensing body 410.

For example, the sensing connector 430 may include a second sensing connector 432. The second sensing connector 432 may extend from an end of the second sensing bridge 422. For example, the second sensing connector 432 may extend from the end of the second sensing bridge 422 toward the first sensing bridge 421.

For example, the sensing connector 430 may include a first sensing connector 431. The first sensing connector 431 may extend from an end of the first sensing bridge 421. For example, the first sensing connector 431 may include a first sensing main connector 4311 extending from the end of the first sensing bridge 421 toward the second sensing bridge 422. For example, the first sensing connector 431 may include a first sensing extension connector 4312 extending or protruding from the end of the first sensing bridge 421 in a direction opposite to a direction in which the first sensing main connector 4311 extends.

The first sensing main connector 4311 and the sensing body 410 may be spaced apart from each other. The first sensing connector 431 may be positioned between the sensing body 410 and the second sensing connector 432. For example, the first sensing main connector 4311 may be positioned between the sensing body 410 and the second sensing connector 432.

The battery sensing unit 400 may be bendable. For example, the battery sensing unit 400 may be bent along a bending line BL. For example, the sensing bridge 420 may be bent along the bending line BL formed or positioned on the sensing bridge 420. The bending line BL may be a virtual line.

The bending line BL positioned on the sensing bridge 420 may be positioned in the sensing bridge distal portions 421*b* and 422*b*. The sensing bridge distal portions 421*b* and 422*b* may include or indicate at least one of the first sensing bridge distal portion 421*b* and the second sensing bridge distal portion 422*b*.

The bending line BL positioned on the sensing bridge 420 may be adjacent to a boundary between the sensing bridge 420 and the sensing connector 430. For example, the bending line BL positioned on the first sensing bridge 421 may be adjacent to a boundary between the first sensing bridge 421 and the first sensing connector 431. For example, the bending line BL positioned on the second sensing bridge 422 may be adjacent to a boundary between the second sensing bridge 422 and the second sensing connector 432.

The bending line BL and the fold line FL positioned on the sensing bridge 420 may form an angle. For example, a distance between the bending line BL and the fold line FL positioned on the sensing bridge 420 may increase as it goes from an outer edge to an inner edge of the sensing bridge 420.

For example, a distance between the bending line BL and the fold line FL positioned on the first sensing bridge 421 may increase as it goes from an outer edge 421*e* to an inner edge 421*i* of the first sensing bridge 421.

For example, a distance between the bending line BL and the fold line FL positioned on the second sensing bridge 422 may increase as it goes from an outer edge 422*e* to an inner edge 422*i* of the second sensing bridge 422.

For example, in the bending line BL and the fold line FL positioned on the sensing bridge 420, a distance between the bending line BL and the fold line FL at the outer edge of the sensing bridge 420 may be less than a distance between the bending line BL and the fold line FL at the inner edge of the sensing bridge 420.

For example, a distance between the bending line BL and the fold line FL at the outer edge 421*e* of the first sensing bridge 421 may be less than a distance between the bending line BL and the fold line FL at the inner edge 421*i* of the first sensing bridge 421.

For example, a distance between the bending line BL and the fold line FL at the outer edge 422*e* of the second sensing bridge 422 may be less than a distance between the bending line BL and the fold line FL at the inner edge 422*i* of the second sensing bridge 422.

For example, a length of the outer edge 421*e* of the first sensing bridge proximal portion 421*a* may be greater than a length of the inner edge 421*i* of the first sensing bridge proximal portion 421*a*. For example, a length of the outer edge 422*e* of the second sensing bridge proximal portion 422*a* may be greater than a length of the inner edge 422*i* of the second sensing bridge proximal portion 422*a*.

For example, a length of the outer edge 421*e* of the first sensing bridge distal portion 421*b* may be less than a length of the inner edge 421*i* of the first sensing bridge distal portion 421*b*. For example, a length of the outer edge 422*e* of the second sensing bridge distal portion 422*b* may be less than a length of the inner edge 422*i* of the second sensing bridge distal portion 422*b*.

Figure 6:
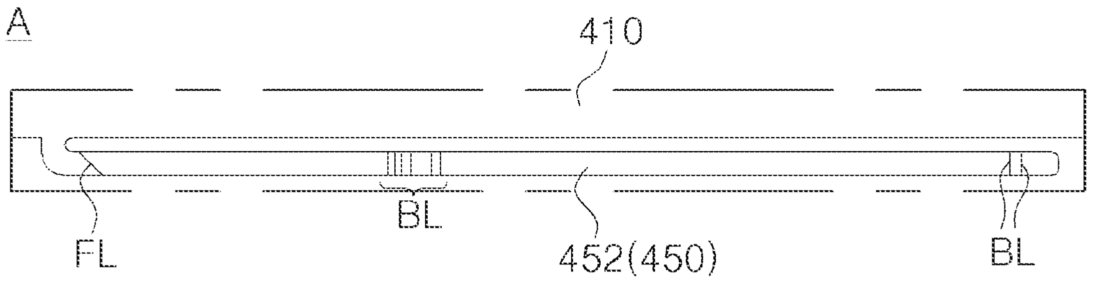
FIG. 6 illustrates a portion "A" illustrated in FIG. 5.
Figure 7:
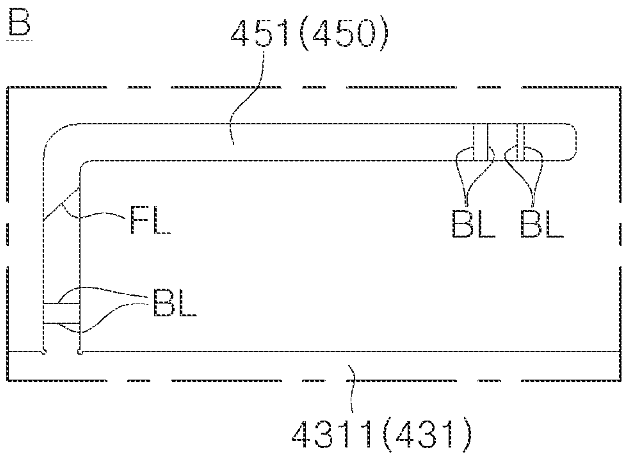
FIG. 7 illustrates a portion "B" illustrated in FIG. 5.

FIG. 6 illustrates a portion "A" illustrated in FIG. 5. FIG. 7 illustrates a portion "B" illustrated in FIG. 5.

Referring to FIGS. 5 to 7, the battery sensing unit 400 may include a sensing extension 450. The sensing extension 450 may be coupled to the temperature sensor. For example, the sensing extension 450 may be electrically connected to the temperature sensor.

For example, the battery sensing unit 400 may include a first sensing extension 451. The first sensing extension 451 may extend from the sensing connector 430. For example, the first sensing extension 451 may extend from the first sensing connector 431. For example, the battery sensing unit 400 may include a second sensing extension 452. The second sensing extension 452 may extend from the sensing body 410.

The sensing extension 450 may include or indicate at least one of the first sensing extension 451 and the second sensing extension 452. The sensing extension 450 may be positioned between the sensing body 410 and the sensing connector 430. For example, the sensing extension 450 may be positioned between the sensing body 410 and the first sensing connector 431.

Figure 8:
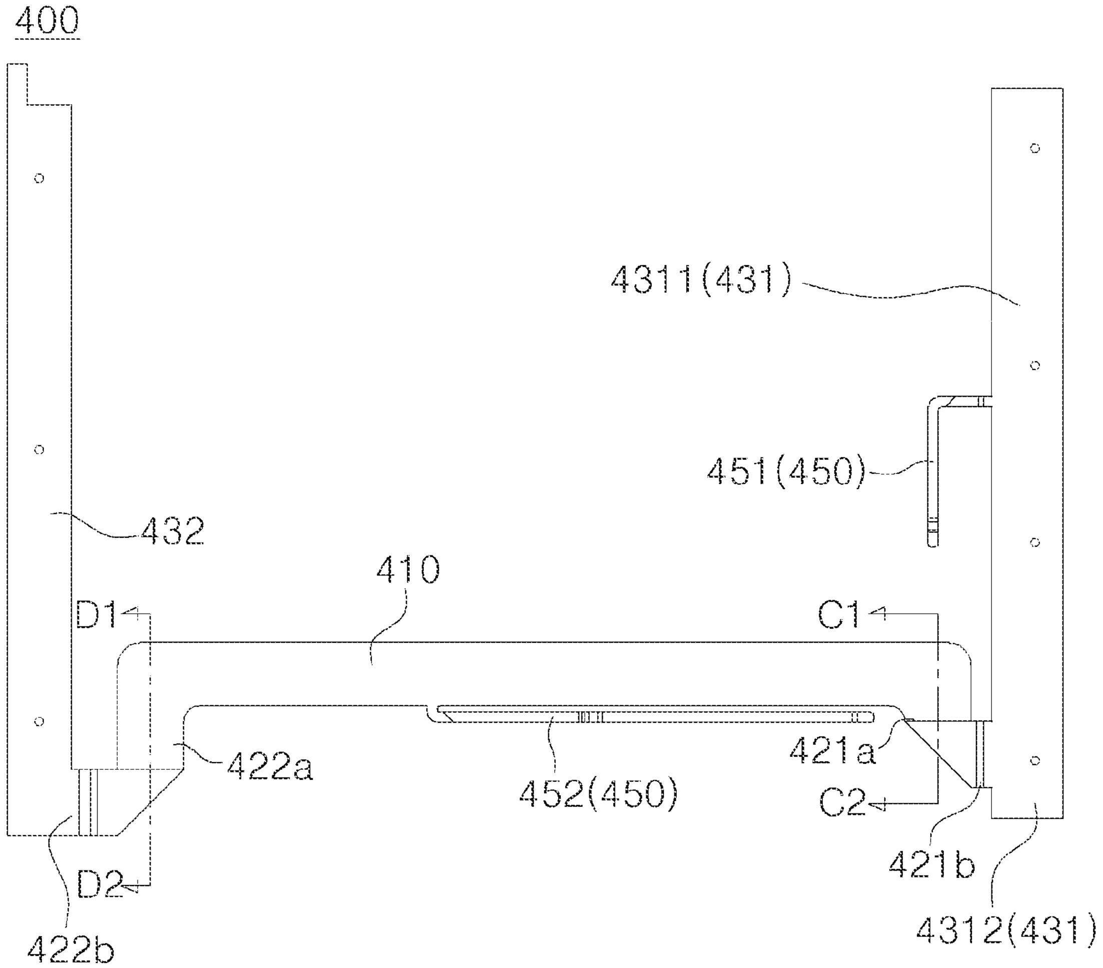
FIG. 8 illustrates that a battery sensing unit illustrated in FIG. 5 is folded along a fold line positioned on a sensing bridge.

FIG. 8 illustrates that a battery sensing unit illustrated in FIG. 5 is folded along a fold line positioned on a sensing bridge. For convenience of explanation, the sensing extension 450 that is not fold may be illustrated in FIG. 8.

Figure 9:
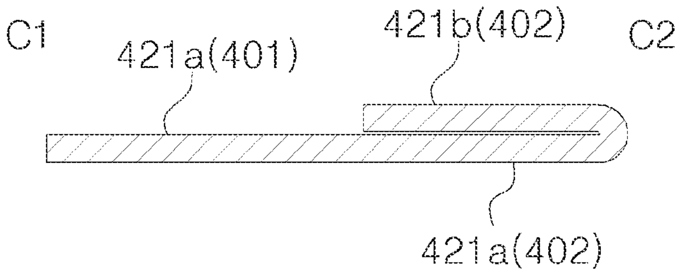
FIG. 9 is a cross-sectional view of a battery sensing unit taken along C1-C2 of FIG. 8.
Figure 10:
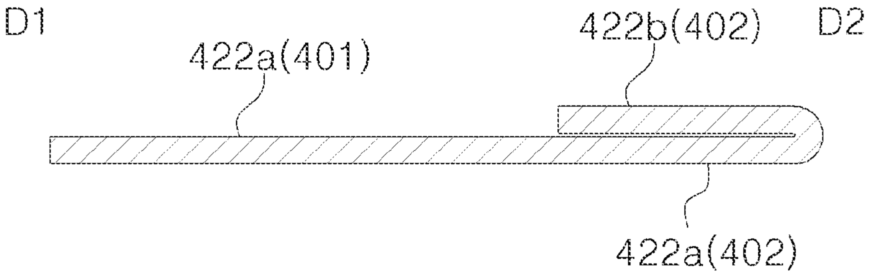
FIG. 10 is a cross-sectional view of a battery sensing unit taken along D1-D2 of FIG. 8.

FIG. 9 is a cross-sectional view of a battery sensing unit taken along C1-C2 of FIG. 8. FIG. 10 is a cross-sectional view of a battery sensing unit taken along D1-D2 of FIG. 8.

Referring to FIGS. 8 to 10, the sensing bridge 420 may be folded along the fold line FL positioned on the sensing bridge 420.

In a process of folding the sensing bridge 420, the sensing body 410 and the sensing bridge proximal portions 421*a* and 422*a* may be fixed, and the sensing bridge distal portions 421*b* and 422*b* and the sensing connector 430 may move.

For example, in the process of folding the sensing bridge 420, the sensing bridge distal portions 421*b* and 422*b* and the sensing connector 430 may be turned over. In other words, in the process of folding the sensing bridge 420, a direction in which the first face 401 and a second face 402 of the sensing bridge distal portions 421*b* and 422*b* face may be interchanged, and a direction in which the first face 401 and the second face 402 of the sensing connector 430 face may be interchanged.

For example, through the process of folding the sensing bridge 420, the second faces 402 of the sensing bridge distal portions 421*b* and 422*b* and the second face 402 of the sensing connector 430 may be observed as shown in FIG. 8.

The sensing bridge proximal portions 421*a* and 422*a* may include at least one of the first sensing bridge proximal portion 421*a* and the second sensing bridge proximal portion 422*a*. The sensing bridge distal portions 421*b* and 422*b* may include at least one of the first sensing bridge distal portion 421*b* and the second sensing bridge distal portion 422*b*.

In the process of folding the sensing bridge 420, the second sensing extension 452 connected to the sensing body 410 may be fixed, and the first sensing extension 451 connected to the sensing connector 430 may move.

As the sensing bridge 420 is folded, a longitudinal direction of the sensing connector 430 may vary. For example, in a state in which the sensing bridge 420 is folded, the longitudinal direction of the sensing connector 430 may be a front-rear direction. For example, in a state in which the sensing bridge 420 is folded, the longitudinal direction of the sensing connector 430 may be the longitudinal direction of the battery module 10 (see FIG. 2).

As the sensing bridge 420 is folded, the arrangement of the sensing connector 430 and the sensing body 410 may vary. For example, in a state in which the sensing bridge 420 is folded, the sensing body 410 may be disposed between the first sensing connector 431 and the second sensing connector 432.

As the sensing bridge 420 is folded, the sensing bridge proximal portions 421*a* and 422*a* and the sensing bridge distal portions 421*b* and 422*b* may overlap. For example, as the sensing bridge 420 is folded, the sensing bridge proximal portions 421*a* and 422*a* and the sensing bridge distal portions 421*b* and 422*b* may face and contact each other.

For example, the sensing bridge 420 may be folded, and an adhesive may be disposed between the sensing bridge proximal portions 421*a* and 422*a* and the sensing bridge distal portions 421*b* and 422*b*. Hence, the sensing bridge proximal portions 421*a* and 422*a* and the sensing bridge distal portions 421*b* and 422*b* may be attached.

For example, the first faces 401 of the sensing bridge distal portions 421*b* and 422*b* and the first faces 401 of the sensing bridge proximal portions 421*a* and 422*a* may face and contact each other. For another example, the second faces 402 of the sensing bridge distal portions 421*b* and 422*b* and the second faces 402 of the sensing bridge proximal portions 421*a* and 422*a* may face and contact each other.

Figure 11:
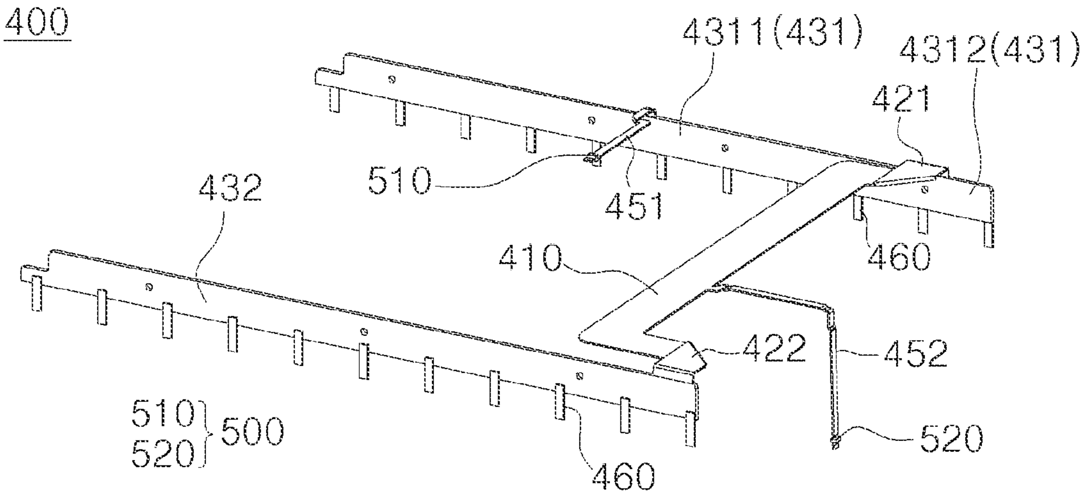
FIG. 11 illustrates an example where a battery sensing unit illustrated in FIG. 8 is bent.

FIG. 11 illustrates that a battery sensing unit illustrated in FIG. 8 is bent.

Referring to FIGS. 5 to 11, the sensing bridge 420 may be bent along the bending line BL positioned on the sensing bridge 420. When the sensing bridge 420 is bent along the bending line BL positioned on the sensing bridge 420, a posture of the sensing connector 430 with respect to the sensing bridge 420 may be changed.

For example, one face of the sensing connector 430 may face or be directed toward the transverse direction of the battery module 10 (see FIG. 2). For example, the first surface 401 of the first sensing connector 431 and the second surface 402 of the second sensing connector 432 may face each other.

The battery sensing unit 400 may be coupled to the bus bar unit 300. For example, the first sensing connector 431 may face the first bus bar unit 310 (see FIG. 2). For example, the first sensing connector 431 may be coupled to the first bus bar unit 310 (see FIG. 2). For example, the first surface 401 of the first sensing connector 431 may be coupled to the first bus bar unit 310 (see FIG. 2).

For example, the second sensing connector 432 may face the second bus bar unit 320 (see FIG. 2). For example, the second sensing connector 432 may be coupled to the second bus bar unit 320 (see FIG. 2). For example, the first face 401 of the second sensing connector 432 may be coupled to the second bus bar unit 320 (see FIG. 2).

The battery sensing unit 400 may include a connector pin 460. The connector pin 460 may have electrical conductivity. For example, the connector pin 460 may include a conductive material such as metal. The connector pin 460 may be coupled to the sensing connector 430. For example, the connector pin 460 may be electrically connected to the sensing connector 430.

The connector pin 460 may be electrically connected to the bus bar unit 300. A voltage or current formed in the battery cell assembly 100 (see FIG. 2) may be applied to the bus bar unit 300 (see FIG. 2). A signal related to the voltage or the current applied to the bus bar unit 300 (see FIG. 2) may sequentially pass through the connector pin 460 and the sensing connector 430 and may be transmitted to the sensing body 410.

The battery module 10 (see FIG. 2) may include a temperature sensor 500. For example, the temperature sensor 500 may include a first temperature sensor 510 connected to the first sensing extension 451. For example, the temperature sensor 500 may include a second temperature sensor 520 connected to the second sensing extension 452.

The temperature sensor 500 may be in contact with or adjacent to the battery cell assembly 100 (see FIG. 2). For example, the first temperature sensor 510 may be in contact with or adjacent to an upper surface of the battery cell assembly 100 (see FIG. 2). For example, the second temperature sensor 520 may be in contact with or adjacent to a front face of the battery cell assembly 100 (see FIG. 2).

The temperature sensor 500 may obtain information on the temperature of the battery cell assembly 100 (see FIG. 2). For example, temperature information obtained by the first temperature sensor 510 may be transmitted through the first sensing extension 451 and the first sensing connector 431 to the sensing body 410. For example, temperature information obtained by the second temperature sensor 520 may be transmitted to the sensing body 410 via the second sensing extension 452.

Referring to FIGS. 1 to 11, the battery sensing unit 400 may include a FPCB. For example, the respective components of the battery sensing unit 400 may be formed as a unibody. For example, the sensing body 410, the sensing bridge 420, and the sensing connector 430 may be formed as a unibody. For example, the sensing body 410, the sensing bridge 420, the sensing connector 430, and the sensing extension 450 may be formed as a unibody.

Since the battery sensing unit 400 is formed as a unibody, the durability of the battery sensing unit 400 can relatively increase. For example, since the battery sensing unit 400 is formed as a unibody, it is possible to reinforce the connection between the sensing connector 430 and the sensing bridge 420 and the connection between the sensing bridge 420 and the sensing body 410.

Figure 12:
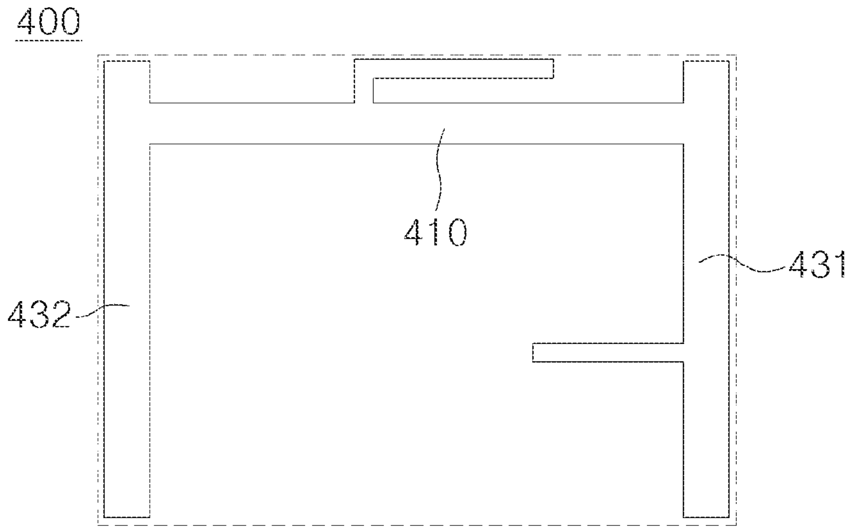
FIG. 12 illustrates an example where an unfolded battery sensing unit is formed on one plane.

FIG. 12 illustrates that an unfolded battery sensing unit is formed on one plane.

As illustrated in FIGS. 3 to 11, the battery sensing unit 400 may be formed by folding and bending an FPCB formed on a plane. As a result, an area of the FPCB required to form the battery sensing unit 400 can be relatively reduced.

For example, an area of the FPCB required for the unfolded battery sensing unit 400 illustrated in FIG. 12 may be larger than an area of the FPCB required for the folded and bent the battery sensing unit 400 illustrated in FIGS. 3 to 11.

The disclosed technology can be implemented in rechargeable secondary batteries that are widely used in battery-powered devices or systems, including, e.g., digital cameras, mobile phones, notebook computers, hybrid vehicles, electric vehicles, uninterruptible power supplies, battery storage power stations, and others including battery power storage for solar panels, wind power generators and other green tech power generators. Specifically, the disclosed technology can be implemented in some embodiments to provide improved electrochemical devices such as a battery used in various power sources and power supplies, thereby mitigating climate changes in connection with uses of power sources and power supplies. Lithium secondary batteries based on the disclosed technology can be used to address various adverse effects such as air pollution and greenhouse emissions by powering electric vehicles (EVs) as alternatives to vehicles using fossil fuel-based engines and by providing battery-based energy storage systems (ESSs) to store renewable energy such as solar power and wind power.

Some embodiments or other embodiments of the disclosed technology described above are not mutually exclusive or distinct from each other. Configurations or functions of some embodiments or other embodiments of the disclosed technology described above can be used together or combined with each other.

Only specific examples of implementations of certain embodiments are described. Variations, improvements and enhancements of the disclosed embodiments and other embodiments may be made based on the disclosure of this patent document.

What is claimed is:

1. A battery sensing unit for sensing a status of a battery module, comprising:
- a sensing body including a first end and a second end that oppose each other and extending from the first end to the second end in a transverse direction of the battery sensing unit;
- a first sensing bridge extending forward from the first end of the sensing body;
- a second sensing bridge extending forward from the second end of the sensing body;
- a first sensing connector forming a shape extending from an end of the first sensing bridge toward the second sensing bridge; and
- a second sensing connector forming a shape extending from an end of the second sensing bridge toward the first sensing bridge,
- wherein the first sensing connector is positioned between the sensing body and the second sensing connector,
- wherein the first sensing bridge and the second sensing bridge are foldable into a state in which the first sensing bridge, the second sensing bridge, the first sensing connector, and the second sensing connector are arranged to extend in a longitudinal direction of the battery sensing unit,
- wherein each of the first sensing bridge and the second sensing bridge is bendable such that the first sensing connector and the second sensing connector face each other.

2. The battery sensing unit of claim 1, wherein the battery sensing unit includes a first face and a second face formed opposite the first face, and
- wherein in a state in which each of the first sensing bridge and the second sensing bridge is folded, a first portion of the first face corresponding to the sensing body faces upward, and each of a second portion of the first face corresponding to the first sensing connector and a third portion of the first face corresponding to the second sensing connector faces downward.

3. The battery sensing unit of claim 1, wherein in a state in which each of the first sensing bridge and the second sensing bridge is folded, the sensing body is disposed between the first sensing connector and the second sensing connector.

4. The battery sensing unit of claim 1, wherein the first sensing bridge is bent between a folded portion of the first sensing bridge and the first sensing connector, and
- wherein the second sensing bridge is bent between a folded portion of the second sensing bridge and the second sensing connector.

5. The battery sensing unit of claim 1, further comprising
- a first sensing extension positioned between the sensing body and the first sensing connector and extending from the first sensing connector.

6. The battery sensing unit of claim 1, further comprising a second sensing extension positioned between the sensing body and the first sensing connector and extending from the sensing body.

7. The battery sensing unit of claim 1, wherein the sensing body, the first sensing bridge, the second sensing bridge, the first sensing connector, and the second sensing connector are formed as a unibody.

8. The battery sensing unit of claim 1, wherein the sensing body, the first sensing bridge, the second sensing bridge, the first sensing connector, and the second sensing connector includes a flexible printed circuit board (FPCB).

9. A battery module comprising:
- a battery cell assembly including a plurality of battery cells arranged in a front-rear direction of the battery cell assembly, each of the plurality of battery cells including a first electrode lead and a second electrode lead that protrude in a first direction and are formed opposite to each other;
- a first bus bar unit coupled to the first electrode lead;
- a second bus bar unit coupled to the second electrode lead; and
- a battery sensing unit configured to connect the first bus bar unit and the second bus bar unit and operable to sense a status of the battery cell assembly,
- wherein the battery sensing unit includes:
- a first sensing connector coupled to the first bus bar unit;
- a second sensing connector coupled to the second bus bar unit;
- a sensing body extending in the first direction;
- a first sensing bridge configured to connect a first end of the sensing body to the first sensing connector, the first sensing bridge being folded and bent; and
- a second sensing bridge configured to connect a second end of the sensing body to the second sensing connector, the second sensing bridge being folded and bent,
- wherein the first sensing connector and the second sensing connector face each other,
- wherein the battery sensing unit further includes a first sensing extension extending from the first sensing connector,
- wherein the battery sensing unit further includes a second sensing extension extending from the sensing body,
- wherein the battery sensing unit includes at least one of:
  - a first temperature sensor connected to the first sensing extension and operable to measure a temperature of the battery cell assembly; or
  - a second temperature sensor connected to the second sensing extension and operable to measure a temperature of the battery cell assembly,
  - wherein the first temperature sensor is positioned on a front face of the battery cell assembly, and
  - wherein the second temperature sensor is positioned on an upper face of the battery cell assembly.

10. The battery module of claim 9, wherein the battery sensing unit includes a flexible printed circuit board (FPCB).

11. The battery module of claim 10, wherein the sensing body, the first sensing bridge, the second sensing bridge, the first sensing connector, and the second sensing connector are formed as a unibody.

12. The battery module of claim 9, wherein the first sensing bridge is bent between a folded portion of the first sensing bridge and the first sensing connector, and wherein the second sensing bridge is bent between a folded portion of the second sensing bridge and the second sensing connector.

13. The battery module of claim 9, wherein the battery sensing unit includes a battery sensor that generates a signal indicative of a battery charge status or a battery discharge status of the battery cell assembly.

* * * * *